(12) United States Patent
Foos

(10) Patent No.: US 9,067,787 B2
(45) Date of Patent: Jun. 30, 2015

(54) METHOD FOR THE FORMATION OF PBSE NANOWIRES IN NON-COORDINATING SOLVENT

(75) Inventor: Edward E Foos, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 1111 days.

(21) Appl. No.: 13/087,642

(22) Filed: Apr. 15, 2011

(65) Prior Publication Data

US 2011/0311814 A1  Dec. 22, 2011

Related U.S. Application Data

(60) Provisional application No. 61/355,260, filed on Jun. 16, 2010.

(51) Int. Cl.
| | |
|---|---|
| *C01B 19/00* | (2006.01) |
| *C01B 19/04* | (2006.01) |
| *B82Y 30/00* | (2011.01) |
| *B82Y 40/00* | (2011.01) |
| *H01L 29/06* | (2006.01) |

(52) U.S. Cl.
CPC ............. *C01B 19/04* (2013.01); *Y10T 428/298* (2015.01); *C01B 19/007* (2013.01); *B82Y 30/00* (2013.01); *B82Y 40/00* (2013.01); *C01P 2004/03* (2013.01); *C01P 2004/16* (2013.01); *C01P 2004/54* (2013.01); *H01L 29/0669* (2013.01)

(58) Field of Classification Search
None
See application file for complete search history.

(56) References Cited

U.S. PATENT DOCUMENTS

| 7,405,129 B2 | 7/2008 | Afzali-Ardakani | |
| 8,003,021 B2 * | 8/2011 | Mokari et al. | 252/519.4 |
| 2012/0273719 A1 * | 11/2012 | Tangirala et al. | 252/182.33 |
| 2013/0048922 A1 * | 2/2013 | Zhou et al. | 252/519.3 |

OTHER PUBLICATIONS

Steckel, et al., "On the Mechanism of Lead Chalcogenide Nanocrystal Formation", J Am. Chem. Soc., 2006, 128, pp. 13032-13033.*
Yu, William W; Preparation and Characterization of Monodisperse PbSe Semiconductor Nanocrystals in a Noncoordinating Solvent; Chem. Mater. 2004, 16, 3318-3322.
Hull, Katherine L; Induced Branching in Confined PbSe Nanowires; Chem. Mater. 2005, 17, 4416-4425.
Cho, Kyung-Sang; Designing PbSe Nanowires and Nanorings through Oriented Attachment of Nanoparticles; J. Am. Chem. Soc. 2005.
Lifshitz, E; Synthesis and Characterization of PbSe Quantum Wires, Multipods, Quantum Rods, and Cubes; American Chemical Society, Nano Lett. vol. 3, No. 6, 2003.

* cited by examiner

*Primary Examiner* — Steven Bos
(74) *Attorney, Agent, or Firm* — US Naval Research Laboratory; Stephen T. Hunnius

(57) ABSTRACT

This disclosure concerns a method of making nanowires in a single flask and in non-coordinating solvent involving the reaction of PbO with oleic acid to produce Pb oleate, heating the Pb oleate to a preferred temperature with additional coordinating ligands, injecting a solution of Se to produce a second solution, heating the second solution, and maintaining the temperature, resulting in nucleation and growth of PbSe nanowires.

10 Claims, 1 Drawing Sheet

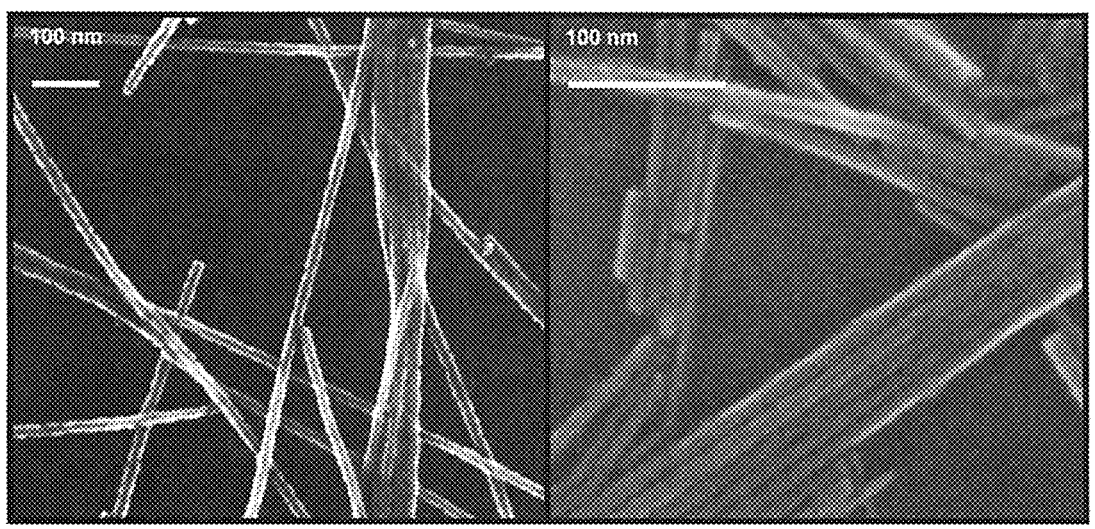

METHOD FOR THE FORMATION OF PBSE NANOWIRES IN NON-COORDINATING SOLVENT

CROSS-REFERENCE TO RELATED APPLICATION

This application is a Non-Provisional application claiming priority to and the benefits of U.S. Provisional Application No. 61/355,260 filed on Jun. 16, 2010, the entirety of which is herein incorporated by reference.

BACKGROUND OF THE INVENTION

1. Field of the Invention

This disclosure concerns a method for the synthesis of PbSe nanowires in a non-coordinating solvent system.

2. Description of Related Art

One-dimensional nanowires possess many device fabrication advantages over their zero-dimensional nanocrystal counterparts. Primarily, these advantages stem from the potential to access the effects of quantum confinement in a structure with one-dimension that extends into the macroscopic regime. This combination of properties can ease difficulties associated with interfacing to a given material, yet still permit transport of electrons through a continuous inorganic structure without relying on hopping or tunneling to adjacent particles. Realization of this concept would be of substantial importance to many electronic applications. A particularly compelling material to examine for this purpose is PbSe, a narrow band gap semiconductor of interest for both photovoltaic and thermoelectric applications due to its large exciton Bohr radius and ability to absorb and emit infrared photons. This material has received significant attention as a potential candidate for exploiting multiexciton generation (MEG) in photovoltaic cells, and high aspect ratio structures may lead to improvements in these devices by reducing the rate of multiexciton Auger recombination.

Various methods have been reported for the formation of one-dimensional nanostructures, with the bulk of these relying on either electrochemical deposition in a pre-formed template or Vapor-Liquid-Solid (VLS) growth from a catalyst droplet on a solid support. The synthesis of nanowires in solution, analogous to the preparation of colloidal nanocrystals, has been less widely examined despite several potential advantages to the approach. This "bottom up" solution synthesis offers both the potential for smaller diameter structures, as well as scalability to obtain larger quantities of material, both important features for their eventual application. In addition, the organic ligands encapsulating these materials facilitate their manipulation in a variety of solvents, expanding possibilities for self-assembly and low cost device processing.

Several methods for the solution preparation of PbSe nanowires have been reported in the literature, but due to issues related to their reproducibility, dimensions, or purification, are not ideal for incorporation into a photovoltaic device. For example, the procedure reported by Lifshitz, et al. employs a $KBH_4$ reduction that generates KCl and oxidized B salts, while Hull et al., utilize a Bi—Au catalyst particle to encourage one dimensional growth. These species represent additional components that must be separated from the product prior to utilization in a device as they could potentially interfere with electron transport. The procedure of Cho et. al. is more straightforward from an isolation standpoint in that the nanowire growth is reported to occur through an oriented attachment of PbSe nanocrystals, but in practice can be difficult to control due to the large volume of reagent that must be rapidly added to the reaction. Additionally, all three of these prior procedures are conducted at a relatively high dilution, increasing the volume of solvent required as the reaction is scaled up.

BRIEF SUMMARY OF THE INVENTION

This disclosure concerns a method of making nanowires in a single flask and in a non-coordinating solvent involving the reaction of PbO with oleic acid to produce Pb oleate, heating the Pb oleate to a preferred temperature with additional coordinating ligands, injecting a solution of Se to produce a second solution, heating the second solution, and maintaining the temperature, resulting in nucleation and growth of PbSe nanowires.

BRIEF DESCRIPTION OF THE DRAWING

FIG. 1 shows Scanning Electron Microscope (SEM) images of PbSe nanowire material produced in non-coordinating solvent in the presence of tetradecylphosphonic acid.

DETAILED DESCRIPTION OF THE INVENTION

The purpose of this invention is a method for the synthesis of PbSe nanowires in a non-coordinating solvent system.

These PbSe nanowires are produced using a single-flask solution phase synthesis reaction employing a non-coordinating solvent. While the general method has been used previously to produce nanocrystals, several important changes have been made in order to induce one-dimensional growth in the system. To synthesize the nanowires, PbO is first reacted with oleic acid in the non-coordinating solvent 1-octadecene (1-ODE). The soluble Pb oleate produced from this reaction is then warmed to 250° C. under $N_2$ or other inert gas and a solution of Se dissolved in trioctylphosphine (TOP) is rapidly injected. The volume of the injected Se reagent solution is important, as it causes an immediate decrease in the overall temperature of the reaction. If this temperature change is too large, the product will be of inferior quality or fail to form entirely. Insufficient heating following the drop will also produce a similar effect. When a molar excess of Pb is present in the reaction (at a preferred ratio of 5:1 Pb:Se) the formation of one-dimensional nanowire structures is observed as the exclusive product, while lower Pb:Se ratios produce mixtures of nanocrystals and nanowires. When both morphologies are formed, extraction of the product with a non-polar solvent such as hexane can be used to isolate the wires by exploiting solubility differences between the two materials. Addition of strongly binding secondary ligands to the Pb reagent prior to the introduction of the Se reagent improves the surface morphology of the final product. In the case of tetradecylphosphonic acid (TDPA), smooth and uniform wires can be formed as illustrated in FIG. 1. The lengths of the nanowires produced using this method range from several hundred nanometers up to ~5 μm, with diameters less than 20 nm. The final product is dispersible in organic solvents for transfer or post-synthetic manipulation. The factors found to be critical for the isolation of the nanowire structure preferentially over nanocrystals are a high Pb:Se ratio, and maintaining a temperature above 200° C. at all times following addition of the Se reagent. Careful monitoring of the temperature is critical to meeting this requirement, as is the ability to reproduce the same drop in temperature from reaction to reaction. As long as these requirements are met, adjustment of the addition temperature can be used to control the diameter of the nanowires, with temperatures lower than 250° C. reducing the average diameter, while temperatures above 250° C. increase the average diameter. Deviation from these procedures leads to isolation of either nanocrystals or shorter one-dimensional structures which possess a high degree of surface roughness and are less suitable for electron transport applications.

Previous methods for the solution preparation of PbSe nanowires have been reported in the literature, but are hindered by issues related to their reproducibility, dimensional control, or product purification as detailed in the Description of Related Art.

Additionally, all of these procedures are conducted at a relatively high dilution as summarized in Table 1.

Table 1 illustrates the overall concentrations of PbSe nanowire synthesis reactions.

| Method | Concentration (M) (based on Pb reagent) |
| --- | --- |
| Prev Meth 1 | 0.01-0.05 |
| Prev Meth 2 | 0.02 |
| Prev Meth 3 | 0.06 |
| This Disclosure | 0.12 |

The overall concentration of the reaction is an important consideration for eventual scale up of the procedure, as dilute reactions require progressively larger amounts of solvents for both the synthesis as well as the purification procedure.

The method detailed in this disclosure circumvents these issues through the use of a more reproducible, higher concentration, single step reaction in a non-coordinating solvent and permits isolation of exclusively one-dimensional PbSe structures with diameters <20 nm suitable for use in nanoelectronics and photovoltaic applications.

Furthermore, the concentrations and non-coordinating solvent employed in the method make it suitable for eventual scale-up.

EXAMPLE

As further detailed herein, this invention concerns a method of making nanowires involving reacting PbO with oleic acid in non-coordinating solvent and producing Pb oleate in a flask, heating the Pb oleate to between 225° C. and 275° C. under inert gas, injecting a first solution of Se dissolved in trialkylphosphine and producing a second solution, heating the second solution, maintaining the temperature greater than 200° C., and resulting in nucleation and growth of PbSe nanowires. The non-coordinating solvent can be 1-octadecene. Excess Pb can be utilized. For example, the molar ratio of Pb:Se can be between 1:1 and 5:1.

This method can further include the step of adding strongly binding secondary ligands to the Pb oleate. The addition of strongly binding secondary ligands prior to the addition of the Se results in improved surface morphology of the PbSe nanowires.

This method can further include the step of adding tetradecylphosphonic acid. The step of adding tetradecylphosphonic acid results in smooth and uniform nanowires.

This method can produce nanowires having the ability to combine quantum confinement effects in two-dimensions with a long axis conducive to electron transport over macroscopic distances. The PbSe nanowires can have a length of from about several hundred nanometers up to about 5 um. The PbSe nanowires can have diameters less than about 20 nm.

Furthermore, the PbSe nanowire can have an aspect ratio of about 100:1 and have a diameter of less than 20 nm. The PbSe nanowire can have the ability to combine quantum confinement effects in two-dimensions with a long axis conducive to electron transport over macroscopic distances.

A mixture composed of PbO (0.2256 g; 1.0 mmol), oleic acid (0.9660 g; 3.4 mmol), TDPA (tetradecylphosphonic acid) (0.1012 g; 0.36 mmol), and 1-ODE (1-octadecene) (3.9115 g; 15 mmol) was prepared in a three neck round bottom flask. The flask was equipped with a magnetic stir bar, thermocouple, vacuum inlet, and heating mantle, then connected to a Schlenk line and evacuated for 20 min (~0.6 Torr) to degas the reagents. During this time, the temperature of the system (as recorded by the thermocouple in the solvent) was brought to ~120° C. Once bubbling of the mixture had ceased, the system was backfilled with $N_2$ and the stopper replaced with a septum sealed adapter connected to an oil bubbler. The temperature was brought past 150° C. under $N_2$ purge, resulting in the formation of Pb oleate as indicated by formation of a clear, colorless solution, after which the system was held under positive $N_2$ for the remainder of the reaction. Heating was continued until the solution reached 250° C. During this time, Se (0.0153 g; 0.19 mmol) was added to a separate flask, septum sealed, and purged with $N_2$. A syringe was used to add 2 mL of TOP (trioctylphosphine) to the Se, and the mixture sonicated until the Se had completely dissolved in the TOP. This solution was loaded into a syringe and rapidly injected into the reaction flask containing the Pb oleate. An immediate temperature drop to 210° C. occurred, accompanied by a darkening of the solution color approximately 10 sec following injection of the reagent. The temperature of the reaction increased to 230° C. over the course of the 1 min reaction. The heating mantle was then removed and the solution cooled rapidly to <70° C. Under an $N_2$ purge, 2.5 mL of heptane was added, followed by 2.5 mL of EtOH. The dark mixture was centrifuged (2500 RPM; 10 min) to isolate a black solid material. It was separated by decantation, dispersed in 2.5 mL of heptane, and re-precipitated by addition of 5 mL of EtOH. The solid was then re-isolated by centrifuge (2500 RPM; 10 min) and washed one additional time with 2 mL of hexane. Following isolation and drying under $N_2$, 5.8 mg of dark solid was obtained.

Careful adherence to the procedures described above are required to obtain suitable product in a reproducible fashion. Changes to the ligands and solvents have been found to impact the product morphology considerably. PbS or PbTe can be formed through a similar method.

While embodiments of the present disclosure have been shown and described, various modifications may be made without departing from the scope. It is to be understood that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A method of making nanowires comprising:
reacting PbO with oleic acid in a non-coordinating solvent and producing Pb oleate in a flask;
heating the Pb oleate to between 225° C. and 275° C. under inert gas;
injecting a first solution of Se dissolved in trialkylphosphine into the flask and producing a second solution;
heating the second solution;
maintaining the temperature greater than 200° C. in the flask; and
resulting in PbSe nanowires.

2. The method of claim 1 wherein the non-coordinating solvent is 1-octodecene.

3. The method of claim 2 wherein the molar ratio of Pb:Se in the flask is between 1:1 and 5:1.

4. The method of claim 1 further including the step of adding strongly binding secondary ligands to the Pb oleate.

5. The method of claim 4 whereby the addition of strongly binding secondary ligands prior to the step of injecting a first solution of Se results in improved surface morphology of the PbSe nanowires.

6. The method of claim 1 further including the step of adding tetradecylphosphonic acid to the flask.

7. The method of claim 6 wherein the step of adding tetradecylphosphonic acid to the flask results in smooth and uniform nanowires.

8. The method of claim 6 wherein the nanowires produced have the ability to combine quantum confinement effects in two-dimensions with a long axis conducive to electron transport over macroscopic distances.

9. The method of claim 1 wherein the PbSe nanowires have a length of from about several hundred nanometers up to about 5 um.

10. The method of claim 9 wherein the PbSe nanowires have diameters less than about 20 nm.

\* \* \* \* \*